(12) United States Patent
Rebaud et al.

(10) Patent No.: US 8,390,312 B2
(45) Date of Patent: Mar. 5, 2013

(54) DEVICE FOR MONITORING THE OPERATION OF A DIGITAL CIRCUIT

(75) Inventors: Bettina Rebaud, Gilly sur Isere (FR); Marc Belleville, Saint-Egreve (FR); Philippe Lionel Maurine, Quissac (FR)

(73) Assignee: Commissariat à l'énergie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/265,207

(22) PCT Filed: Apr. 20, 2010

(86) PCT No.: PCT/EP2010/055222
§ 371 (c)(1),
(2), (4) Date: Nov. 29, 2011

(87) PCT Pub. No.: WO2010/122036
PCT Pub. Date: Oct. 28, 2010

(65) Prior Publication Data
US 2012/0074982 A1    Mar. 29, 2012

(30) Foreign Application Priority Data
Apr. 20, 2009 (FR) ...................................... 09 52560

(51) Int. Cl.
*H03K 19/003* (2006.01)
(52) U.S. Cl. .................. 326/9; 326/14; 326/21; 326/93

(58) Field of Classification Search ........................ None
See application file for complete search history.

(56) References Cited

U.S. PATENT DOCUMENTS

| | | | |
|---|---|---|---|
| 2006/0119397 A1 | 6/2006 | Ferraiolo et al. | |
| 2007/0162798 A1* | 7/2007 | Das et al. ........................ | 714/724 |
| 2010/0079184 A1* | 4/2010 | Bowman et al. .............. | 327/225 |

OTHER PUBLICATIONS

International Search Report as issued for PCT/EP2010/055222.

(Continued)

*Primary Examiner* — Anh Tran
(74) *Attorney, Agent, or Firm* — Pillsbury Winthrop Shaw Pittman, LLP

(57) ABSTRACT

A digital electronic circuit includes: a plurality of sequential elements; at least one data-conducting path connecting an input sequential element to a destination sequential element; a clock outputting a clock signal on a clock tree for setting the speed of the sequential elements; a monitoring device receiving, as an input, at least one data signal traveling on a conducting path and arriving at a destination sequential element, the monitoring device including: a module for defining at least one detection window according to the clock tree; and a detector for detecting a transition of each data signal received during a detection window; and wherein each detection window is defined so as to enable the detection or anticipation of a fault corresponding to a violation of the rise time or the maintenance time of a data signal relative to a clock signal edge received by the destination sequential element receiving the data signal.

11 Claims, 3 Drawing Sheets

OTHER PUBLICATIONS

Kalisz et al.; "Dual-Edge Late-Transition Detector for Testing the Metastability Effect in Flip-Flops"; Microelectronics, 2004, ICM 2004 Proceedings, The 16th International Conference on Tunis, Tunisia, Dec. 6-8, 2004 Piscataway, NJ, USA, Dec. 6, 2004, pp. 780-782.

"Yada et al.; Modified Stability Checking for On-Line Error Detection"; VLSI Design, 2007, Held Jointly with 6th International Conference on Embedded Systems, 20th International Conference on, IEEE, PI, Jan. 1, 2007, pp. 787-792.

Agarwal et al.; "Optimized Circuit Failure Prediction for Aging: Practicality and Promise"; Test Conference, 2008, ITC 2008, IEEE International, IEEE Piscataway, NJ, USA, Oct. 28, 2008, pp. 1-10.

Das et al.; "RazorII: In Situ Error Detection and Correction for PVT and SER Tolerance"; IEEE Journal of Solid-State Circuits, IEEE Service Center, Piscataway, NJ, US, vol. 44, No. 1, Jan. 1, 2009.

* cited by examiner

DEVICE FOR MONITORING THE OPERATION OF A DIGITAL CIRCUIT

CROSS REFERENCE TO RELATED APPLICATIONS

This application is the U.S. National Stage of PCT/EP2010/055222, filed Apr. 20, 2010, which in turn claims priority to French Patent Application No. 0952560, filed Apr. 20, 2009, the entire contents of all applications are incorporated herein by reference in their entireties.

The present invention relates to a device for monitoring and supervising the operation of a digital circuit. Its purpose is essentially to anticipate and/or detect signals that violate the timing constraints, particularly the timing constraints associated with rise times and maintenance times of flip-flop or latch type memory elements while the digital circuit in question is in operation.

The field of the invention is generally that of digital electronic circuits. Circuits of such kind use a clock that generates a clock signal at a predetermined frequency, called the clock frequency, to set the speed of data transfers, particularly between flip-flop or latch type sequential elements. One of the most effective ways to improve the timing performances of digital circuits is to try to use the highest possible clock frequency.

Also, in digital electronic circuits a certain number of verifications, called timing verifications, must be carried out to ensure that the circuit is conforming to the performance constraints, and more specifically, to verify that the circuit remains operational at the prescribed clock frequency. These verifications are carried out by calculating the propagation times along the data and clock paths in the circuit, while ensuring that the maintenance and rise time constraints of the arrival flip-flops/latches are not violated—these are called timing violations—, for the entire circuit. The rise time of a flip-flop/latch corresponds to the minimum stability time that a data signal must conform to at the flip-flop input before the clock signal edge appears so that it is effectively considered by the flip-flop/latch. The maintenance time of a flip-flop/latch corresponds to the minimum stability time that a data signal must conform to at the flip-flop/latch input after the clock signal edge appears so that the data signal is effectively considered by the flip-flop/latch.

In microscale technologies, worst-case analyses are used to identify the critical paths that limit the operating frequency of the circuit and to estimate realistically the propagation times along these paths. In practice, the critical paths correspond to the paths that a signal is likely to take, and for which the risks of timing violations are most probable. The timing margin (slack) is defined as the difference between the expected arrival time of the signal and the arrival time that causes a violation of the constraint.

In the context of circuit design in nanoscale technology, and more particularly in low power consumption circuits, the margins assumed for the purposes of worst-case analyses are becoming very pessimistic, to the point that the circuit cannot be optimised effectively. In fact the variations in manufacturing processes, environmental variations—such as localised, temporary drops in the supply voltage—, or even the occurrence of temperature gradients, are just some of the phenomena whose impact on circuit performances mean that larger and larger timing margins have to be taken into account in order to be certain that all eventualities are covered if the modern analysis methods are applied.

The dynamic variations of the timing performances, caused by dynamic variations in temperature and supply voltage that are difficult to predict, mean that the circuit performances must now be monitored online by integrating elements in the circuit itself that are able to detect these fluctuations and find the optimum operating point of the circuit by reducing as far as possible the timing margins introduced by the use of modern delay analysis methods.

As a first measure, the digital circuit's performances can be monitored online by integrating ring oscillators or using replicas of critical paths to determine the maximum operating frequency. But these sensors consume power, are bulky and difficult to operate, they only cover the global variations in the circuit and the presence of local variations dramatically impact their effectiveness.

In order to take local variations into account, another solution for providing online performance monitoring consists in suggesting a system that is integrated in the functionality of the circuit itself. In the document: "Das, S et al. "A self-tuning DVS processor using delay-error detection and correction", IEEE_JSSC, 2006, 41, 792-804", flip-flops called RAZOR flip-flops enable rise time violations to be detected by using the redundancy at the level of the sequential elements, particularly of the flip-flop type. However, this solution has a number of problems: in order to achieve an acceptable coverage rate on critical paths, it is necessary to minimise the impact of inserting this redundancy, as RAZOR flip-flops take up two to three times more silicon surface area than conventional flip-flops, and consume significantly more power. Another method, based on verification of the stability of the data, relies on a material verification structure whose function is to compare the flip-flop input and output to detect any timing violations. Such a method is described for example in the following document: "Yada et al. "Modified Stability Checking for On-line Error Detection" proceedings of VLSID'07, 20th International Conference on VLSI Design, 2007".

While this method has the advantage of considerably reducing the cost in terms of silicon surface, particularly compared with the solution in which RAZOR flip-flops are used, unfortunately the timing windows for error detection that characterize the verification structures are fixed and too wide in both examples. So then a problem arises: if a critical path has been identified between a first sequential element and a second sequential element, and if another, shorter path exists between another sequential element (or possibly between the first sequential element) and this second sequential element; it is then necessary to add a certain number of delay cells—or buffers—on this shorter path, thus slow the propagation of the signal between the two sequential elements in question in order to avoid maintenance time violations at the input de sequential element when the signal takes this shorter path. Also, these structures can only be inserted in architectures that include an adjustment module, that is to say an error correction module, for example by re-executing the sequence that is identified as faulty at a lower frequency. This is why this approach is designed primarily for high performance processors with high calculation rates.

The document "Agarwal et al. "Optimized Circuit Failure Prediction for Aging Practicality and Promise", International Test conference Oct 08" suggests a lighter system than RAZOR, which enables faults to be anticipated and thus avoid the need to insert an adjustment module.

However, its implementation is such that the width of the anticipation window is closely correlated with the environmental conditions of the circuit, which raises problems of margins that vary when seeking the optimum point (tension, frequency).

The monitoring device according to the invention suggests a solution to the problems and drawbacks described in the preceding. In the invention, a solution is suggested for anticipating and/or detecting signals that violate the timing constraints, while the circuit is operating. For this purpose, a means is provided in the invention for generating a timing window, generated from the clock signal of the digital circuit in question, the duration and recurrence of which are determined very precisely; it is also provided in the invention to make effective use of the clock tree, which is already present particularly in digital logic circuits that use flip-flops/latches as data sampling elements.

In general, the device according to the invention thus enables rise and maintenance time violations caused by dynamic variations to be anticipated and detected by the positioning of a timing window preceding the arrival of the clock signal edge; for a given digital circuit, the device according to the invention also enables the static (quality of the circuit defined by giving all of the parameters characterizing the technology with which it was designed after its manufacture) and/or dynamic variations (aging of the components, variations in the supply voltage, in the temperature, or any other variation that occurs temporarily during the lifetime of the circuit and affects the timing performances of the circuit) of the digital circuit under consideration, particularly by determining the maximum operating frequencies of the clock signal.

The invention thus essentially relates to an electronic digital circuit comprising:
 a plurality of sequential elements;
 at least one data-conducting path connecting an input sequential element to a destination sequential element;
 a clock outputting a clock signal on a clock tree for setting the speed of the sequential elements;
 characterized in that it comprises a monitoring device which receives as an input at least one data signal travelling on a conducting path and arriving at destination sequential element, the monitoring device comprising:
  means for defining at least one detection window according to the clock tree; and
  means for detecting a transition of each data signal received during a detection window; and
  in which each detection window is defined so as to enable the detection or anticipation of a fault corresponding to a violation of a rise time or a maintenance time of a data signal relative to a clock signal edge received by the destination sequential element that receives this data signal.

Besides the characterizing features described in the preceding paragraph, the circuit according to the invention may also include one or more additional characterizing features from those listed in the following:
 said detection means of the monitoring device detect a signal transition on the same detection window for several received data signals arriving respectively at several destination sequential elements.
 said means for defining at least one detection window include a generator circuit that is inserted in the clock tree, and this generator circuit propagates the clock signal at least as far as a destination sequential element and delivers at least one timing signal that enables the generation of at least one detection window.
 at least one detection window is variable, the means for defining a detection window receiving at least one monitoring signal that enables the definition of a variable detection window.
 at least one detection window is positioned before an edge of the clock signal.
 at least one detection window is positioned around an edge of the clock signal.
 at least one detection window is positioned after an edge of the clock signal.
 the monitoring circuit includes at least one memory element for storing at least one transition detected with the transition detection means.
 the digital electronic circuit further includes means for regulating the frequency of the clock signal depending on the transitions detected by the transition detection means.
 the digital electronic circuit further includes means for regulating the operating voltage of the circuit and/or the voltage of the substrate depending on the transitions detected by the transition detection means.
 the sequential elements are passing type flip-flops on an edge of the clock signal.

The present invention also relates to a device for monitoring the operation of an electronic digital circuit, the digital circuit particularly including:
 a plurality of sequential elements, particularly of the flip-flop type;
 a plurality of data-conducting paths, each path of the plurality connecting two sequential elements of said plurality of sequential elements;
 a clock outputting a clock signal, which clock signal sets the speed particularly of the sequential elements;
 characterized in that the monitoring device includes at least one monitoring circuit, this monitoring circuit receiving as input:
  a data signal travelling on one of the conducting paths of the plurality of conducting paths;
  a timing signal transmitted to generate a variable window, called a variable detection window, the timing signal having a high alternation with a duration shorter than the high alternation of the clock signal;
  and in that the monitoring circuit includes means for detecting a transition of the data signal during the detection window.

Besides the main characterizing features that were listed in the preceding paragraph, the device according to the invention may also include one or more additional characterizing features from those listed in the following:
 the device according to the invention includes means for generating the variable detection window and positioning it before an edge of the clock signal;
 the device according to the invention includes means for generating the variable detection window and positioning it around an edge of the clock signal;
 the device according to the invention includes means for generating the variable detection window and positioning it after an edge of the clock signal;
 the device according to the invention includes means for generating a plurality of detection windows, with at least one detection window before a rising edge of the clock signal, and at least one detection window around an edge of the clock signal;
 the monitoring circuit includes at least one memory element for storing the transitions detected with the means for detecting the transition of the data signal during the detection window;
 the monitoring circuit includes at least one transistor used to transmit the timing signal to the means for detecting the transition of the data signal of the monitoring circuit;
 in order to generate at least the timing signal transmitted in the form of a variable window, the monitoring circuit includes a generator circuit, which generator circuit particularly includes a combinatorial element that receives a first signal corresponding to the clock signal, possibly delayed, at a first input, and a second signal, corresponding to the first signal after it has passed through at least one inverter element and/or at least one combinatorial gate type non-inverting element, at a second input;

the combinatorial element of the generator circuit is of the NAND gate type.

To the extent that they do not exclude one another, the various additional characterizing features of the device according to the invention may be combined in any permutation to yield Various examples of the implementation of the method according to the invention.

The invention and its various applications will be better understood by reading the following description and referring to the accompanying figures.

These are offered solely for illustrative purposes and are not intended limiting of the invention in any way.

The various elements that appear in different figures are identified with the same references except where indicated otherwise.

Figure 1:
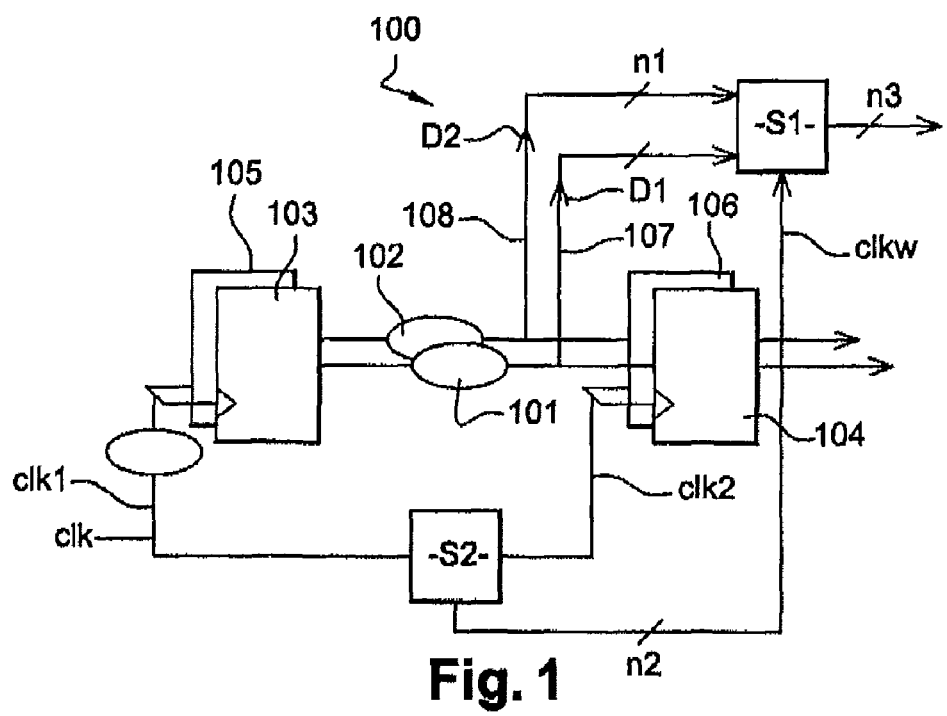
FIG. 1 is a diagrammatic illustration of an electronic digital circuit in which the device according to the invention has been integrated.

FIG. 1, is a schematic representation of a part of a digital circuit 100 with a first data conducting path 101 and a second data conducting path 102 connecting a first flip-flop type input sequential element 103 to a first flip-flop type destination sequential element 104, and a second flip-flop type input sequential element 105 to a second flip-flop type destination sequential element 106 respectively. Each data path is typically constituted of logic gate type combinatorial elements that the data passes through at it travels on the paths under consideration. According to the invention, a transition detection circuit S1 is inserted in the digital circuit, which transition detection circuit receives as input data signals D1 and D2 travelling on first path 101 and second path 102, via a first bypass link 107 and a second bypass link 108 respectively. A first clock signal Clk is transmitted after it has passed to the flip-flops 103 and 105 to one part of the clock tree (clk1), and at the same time to the rest of the clock tree, then to a timing window generator circuit S2. The timing window generator circuit S2 supplies a second clock signal Clk2 to flip-flops 104 and 106, and a timing signal consisting of at least one variable detection window to detection circuit S1. In practical terms, the monitoring device according to the invention essentially consists of the detection circuit S1 and the generator circuit S2.

Thus, as shown in FIG. 1, detection circuit S1 is inserted in digital circuit 100 in the data paths, close to the circuit flip-flops. Detection circuit S1 receives as input signals n1 signals coming from the combinatorial part (data paths) and n2 signals coming from generator circuit S2, whose function is to calibrate one or more detection timing windows, which will be used by detection circuit S1.

Detection circuit S1 supplies n3 outputs, which are activated when a transition in a data signal has been effectively detected while at least one detection timing window was active, as will be explained in greater detail in the following.

Thus generator circuit S2 is inserted in the clock path of digital circuit 100. In general, generator circuit S2 may be located anywhere in digital circuit 100; however, it is preferable to keep the insertion consistent with the symmetry of the clock tree. It is also advantageous to position generator circuit S2 closest to the flip-flops, that is to say at the end of the leaf of the clock tree, in other words close to detection circuit S1 in order to avoid introducing problems associated with lag in the arrival time of the clock signal at the and of the various tree leaves (skew).

S2 receives the clock signal as input and generates one or more signals clkw enabling calibration of the detection window(s) and sending the signals to S1, while still transporting the clock to its destination. S2 may also receive control signals which may be used to select which detection windows are to be sent via wires n2.

Figure 2:
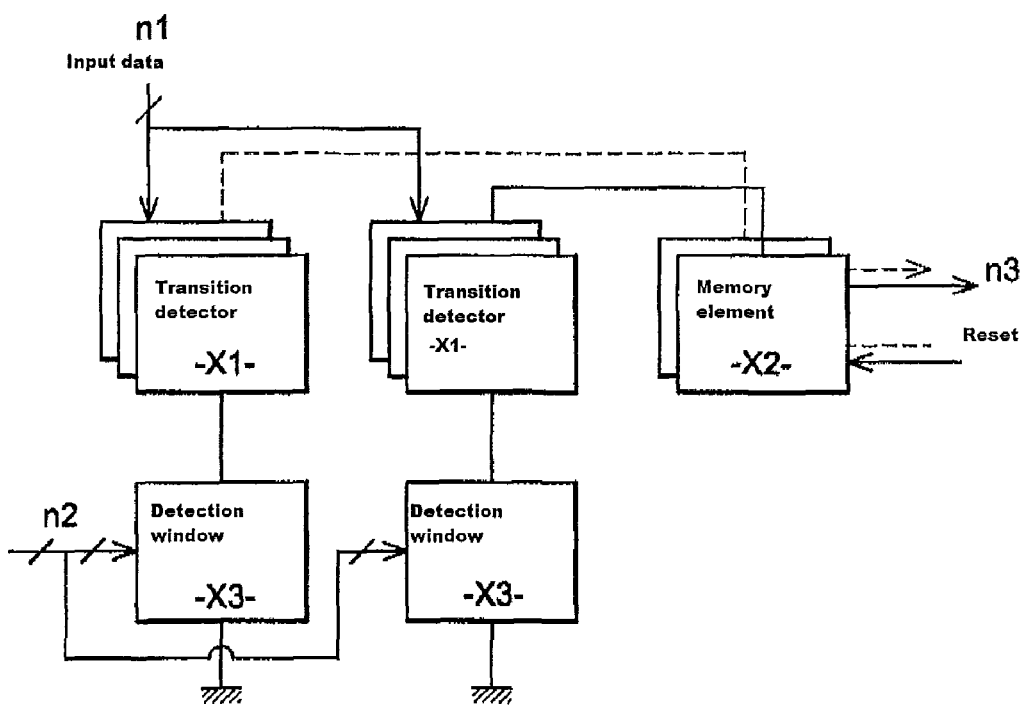
FIG. 2 is schematic diagram of a functional representation of a monitoring/observation circuit of the monitoring/observation device according to the invention.

As is shown schematically in FIG. 2, detection circuit S1 functions according to the known principle referred to as XOR by discharging-the input capacitance of the following gate. This it is made up of the following elements:

transition detection means, also called transition detectors, X1; according to the invention, there are as many transition detectors X1 as detection circuit S1 will allow input signals, n1 in the example shown;

at least one memory element X2, numbered n3-n3 also being the number of output bits from transition detection circuit S1 in the example shown, whose function is to store information on the transitions detected in the data signals while the timing windows are active; each memory element may also receive as input an external control signal which is able to clear the contents of the memory in question;

at least one element X3, numbered n2 in the example shown, of insertion of the transition detection window, for inserting the detection window in detection circuit S1 at the level of transition detectors X1. It should be noted that there are as many output bits from transition detection circuit S1 as there are detection windows X3 activated at the same time.

Figure 3:
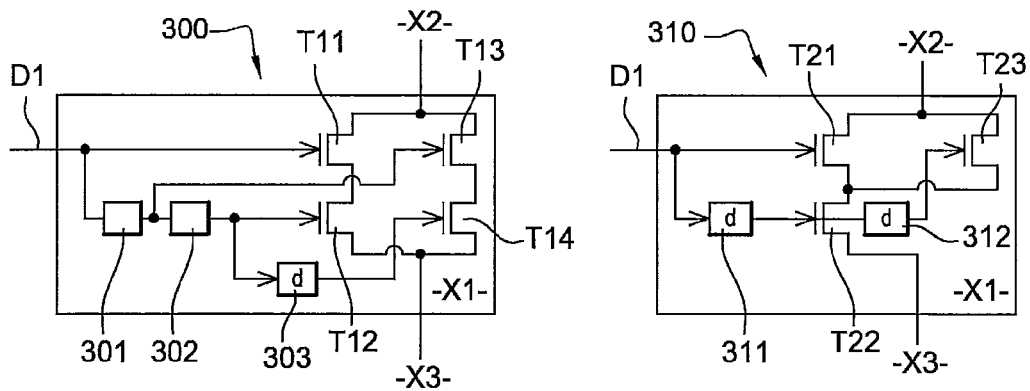
FIG. 3 shows various embodiments of a transition detection element of the monitoring/observation circuit of the monitoring/observation device according to the invention.

FIG. 3 illustrates two embodiments of a transition detector X1.

A first embodiment 300 has the following architecture:

a first field effect transistor (FET) (N-channel) T11 receives a data signal D1 at its gate; the drain of FET T11 is connected to a memory element X2;

a second N-channel FET T12 also receives signal D1 at its gate after the signal has passed through a first inverter delay 301 and a non-inverter delay 302; the function of an total inverter delay is to hold a signal up and invert it; inverter delys are for example created using logic cells; the drain of FET T12 is connected to the source of FET T11;

a third n-channel FET T13 receives signal D1 at its gate after the signal has passed through first inverter delay 301; the drain of FET T13 is connected to memory element X2;

a fourth n-channel FET receives signal D1 at its gate after the signal has passed through first inverter delay 301, non-inverter delay 302 and an inverter delay 303; the drain of FET T14 is connected to the source of FET T12;

the source of FET T12 and the source of FET T14 are connected to an element X3.

A second embodiment 310 has the following architecture:

a first n-channel FET T21 receives a data signal D1 at its gate; the drain of FET T21 is connected to a memory element X2;

a second n-channel FET T22 also receives signal D1 at its gate after the signal has passed through a first inverter delay 311; the drain of FET T22 is connected to the source of FET T21;

a third n-channel FET T23 receives signal D1 at its gate after the signal has passed through the first inverter delay 311 and a second inverter delay 312; the drain of FET T23 is connected to memory element X2; the source of FET T23 is connected to the drain of FET T22;

the source of FET T22 is connected to an element X3.

Thus, in general, transition detector X1 takes as input the data arriving in front of the flip-flop and detects the rising or falling edge. In the examples described, it is simply composed of n-transistors that enable discharge of the input capacitance from the connection gate contained in X2, the memory element that enables the discharge value to be backed up and delivers a signal 0 or 1 depending on the desired polarity. It will be noted that, quite obviously, a perfectly equivalent structure can be made in PMOS transistor-based dual logic, and in fact even with a combination of NMOS and PMOS.

In the case of multiple inputs, the structure of transition detector X1 is repeated in parallel as many times as there are input data signals. It will also be noted that a similar structure can also be implemented in dynamic logic, recreating all the elements of transition detector X1 (on one or more inputs), associated with an module X2 that preloads the output from X1 during the phase of the clock when it is not evaluated and generates a signal that may be stored at a higher level.

Figure 4:
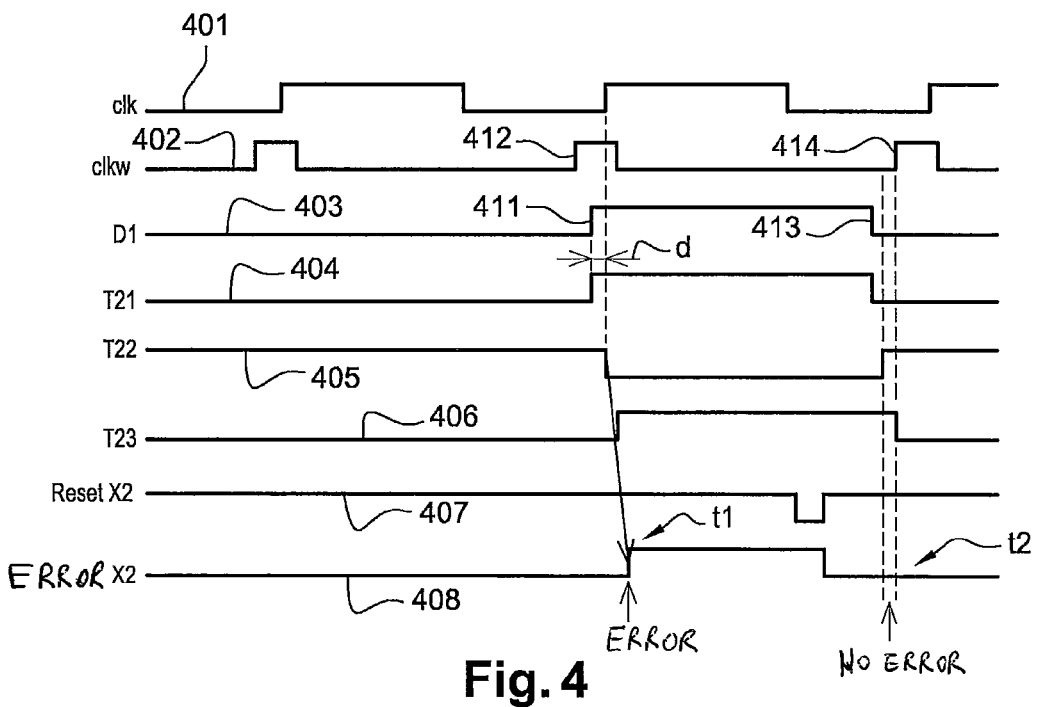
FIG. 4 shows various chronograms of different signals arriving in one of the examples of a detection circuit of FIG. 3.

The chronograms in FIG. 4 will now be used to explain how the second embodiment 310 enables the transition of data signal D1 to be detected.

In this figure:

a first chronogram 401 shows the development over time of clock signal clk in digital circuit 100;

a second chronogram 402 shows the development over time of detection window clkw;

a third chronogram 403 shows the development over time of data signal D1;

a fourth chronogram 404 shows the development over time of the pass/block nature of first FET T21;

a fifth chronogram 405 shows the development over time of the pass/block nature of second FET T22;

a sixth chronogram 406 shows the development over time of the pass/block nature of third FET T23;

a seventh chronogram 407 shows the development of a reinitialisation signal for memory element X2;

an eighth chronogram 408 shows the development of the error information stored in memory element X2 if the selected polarity is such that detection takes place when the "error" parameter takes on value "1".

In the example shown, according to the architecture of second example 310, there is discharge at the input to memory element X2 if one of the two following combinations is observed:

the detection window is active (signal clkw has binary value 1), and FETs 21 and 22 are allowing the signals to pass; in this case, a transition from 0 to 1 of data signal D1 is detected;

the detection window is active, and FETs 23 and 22 are allowing the signals to pass; in this case, a transition from 1 to 0 of data signal D1 is detected.

Thus, the chronograms shown correspond to the case in which an error has been detected at a time t1, data D1 arriving (rising edge 411) at the flip-flop after the rising edge of the detection window (rising edge 412). On the basis of this observation, it may be stated that the path travelled by D1 is too long with respect to the clock frequency used. Consequently, the clock frequency will have to be reduced.

Conversely, at time t2, which immediately follows the transition of the data signal from value 1 to value 0, no errors are detected, data signal D1 presents a falling edge 413 arriving far enough in front of a new detection window indicated by a rising edge 414. The path taken by data D1 in this case is shorter then the previous path, which prompted the error at time t1.

Figure 5:
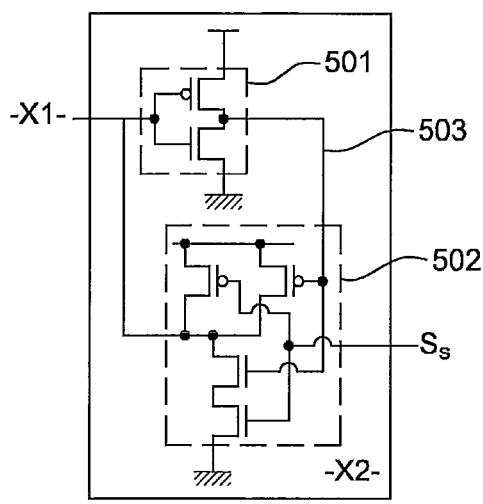
FIG. 5 shows an exemplary embodiment of a memory element of the monitoring circuit of the du monitoring device according to the invention.

FIG. 5 illustrates an embodiment of a memory element X2. In this example, memory element X2 consists of an inverter circuit 501 and a NAND type logic circuit 502, this last making it possible to store detected error information in a memory. The signal that is output from transition detector X1 is transmitted simultaneously to inverter circuit 501 and to NAND type logic circuit 502, wherein these two circuits are connected to one another via a link 503.

Thus in general, memory element X2 retains the value of transition detection, advantageously to transmit it at a higher level in a global system incorporating the monitoring device according to the invention; memory module X2 may advantageously be reset to zero with a specific signal Ss transmitted to NAND type logic circuit 502. Of course, there are many possible options for implementing memory element X2 (latch, inverter +flip-flop, . . . ).

In order to discretise the information coming from the various timing windows, it is necessary to have as many memory elements X2 as there are created timing windows coming from timing window generator circuit S2.

Figure 6:
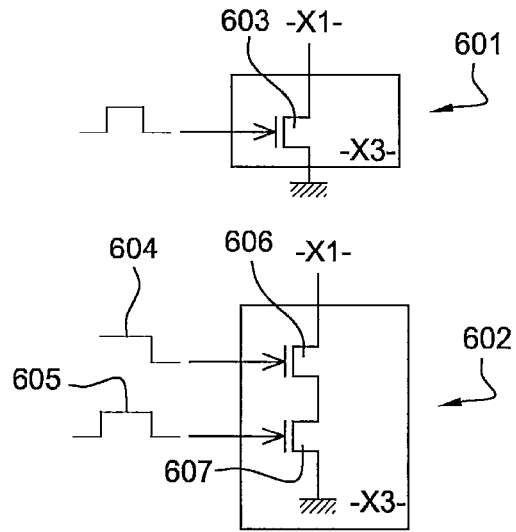
FIG. 6 shows various exemplary embodiments of a structure that enables the detection window to be inserted in the transition detection circuit.

FIG. 6 illustrates various embodiments of a structure X3 that enables insertion of the detection window in the transition detection circuit. The role of structure X3 in transition detection circuit S1 is to enable a signal giving information about a transition of a data signal to be discharged if and only if the detection window is active. According to a first embodiment of structure X3, corresponding to a situation in which a single pulse produced by generator circuit S2 is sufficient to cover the desired window, just one transistor 603 is needed. According to a second embodiment of structure X3, corresponding to a situation in which generator circuit S2 produces a first signal 605 intended to open the detection window, and a second signal 604, intended to close the detection window, it is necessary to use a first transistor 606 and a second transistor 607, for example n-type FET transistors, the source of first transistor 606 being connected to the drain of second transistor 607, the signals generated by the generator circuit being received by the gates of the two transistors. Also, it is entirely possible to include the control logic before or integrated in structure X3 enabling or preventing activation of the sensor system.

Figure 7:
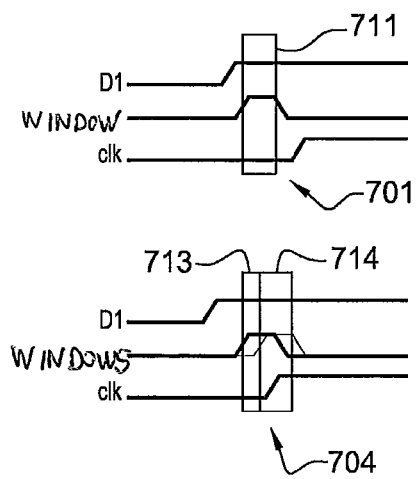
FIG. 7 shows various examples of possible use of the monitoring/observation device according to the invention.
Figure 7:
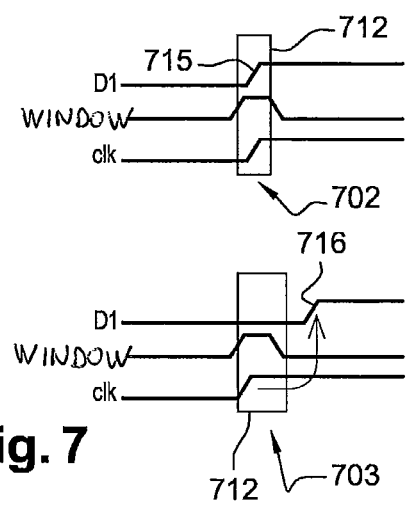

The monitoring device according to the invention may be used in various modes, particularly those shown in FIG. 7.

In a first mode 701, the device is used to anticipate faults by placing a detection window 711 in front of the rising edge of the clock signal.

In a second mode 702 and 703, the device is used as a fault detector by placing a detection window 712 around the rising edge of the clock signal. In the first case, 702, an error is detected, data signal D1 presenting a rising edge 715 during detection window 712. In the second case, 703, no error is detected, data signal D1 presenting a rising edge 716 after detection window 712; these different scenarios have been described in detail with reference to FIG. 4.

In a third mode 704, the device is used as a fault message discriminator by generating multiple detection windows, for example a first window 713 and a second window 714, positioned in front of and on the clock edge respectively. In the invention, when there are multiple detection windows, the signals associated with these windows may be generated, and then propagated independently by generator circuit S2, or they may be created within transition detection circuit S1 from starting signals by introducing delays into circuit S1; in the second scenario, the number of conducting wires present at the input to circuit S1 is limited.

Figure 8:
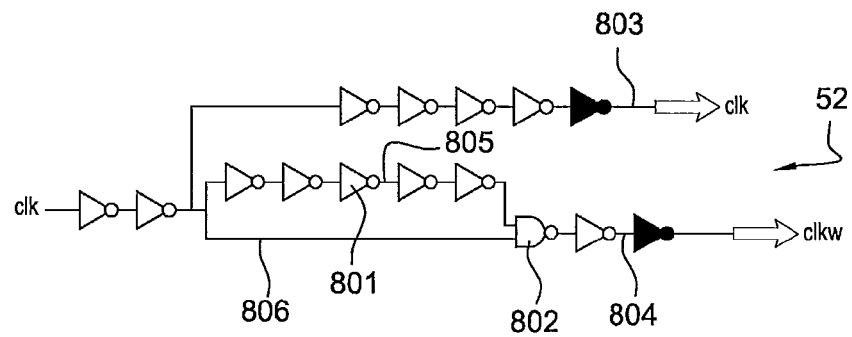
FIG. 8 shows an exemplary embodiment of a generator circuit for a timing window used in the monitoring device according to the invention.

FIG. 8 shows an embodiment of a generator circuit S2 whose function is to propagate a quality clock signal clk to the flip-flops at the level of a first branch 803, while generating at the level of second branch 804 and from the same clock signal clk the elements necessary for creating detection windows clkw. To this end, it is suggested according to the invention to use the propagation time of the clock signal, particularly with the aid of inverter type elements, to be able to calibrate and adjust the detection window and the clock signal.

Thus, in the example shown, to create a long path we implemented a series of inverters 801 and buffers on first link 805 of second branch 804, the number of inverters and buffers depending particularly on the delay variations observed and the variations in power supply or temperature. The detection window is generated by the presence of a NAND gate 802 that receives as input the first link 805 on the one hand and on the other hand second link 806 from second branch 804, which conveys clock signal clk, this second link forming a short path. Thus a detection window is generated that has a high alternation which is shorter than the high alternance of the clock signal.

Apart from is function of anticipating timing constraint violations, the monitoring device according to the invention offers very good temporal resolution without the need to add buffers to fill in any faults in the maintenance times of the flip-flops arranged on different paths. Online detection of the criticality of signals is advantageously used to enslave the clock frequency and/or the operating voltage and/or the substrate voltage on order to maintain the digital function in a reliable, optimal operating zone.

The invention claimed is:

1. An electronic digital circuit comprising:
   a plurality of sequential elements;
   at least one data-conducting path connecting an input sequential element to a destination sequential element;
   a clock outputting a clock signal on a clock tree for setting the speed of the sequential elements;
   a monitoring device configured to receive as an input at least one data signal travelling on a conducting path and arriving at a destination sequential element, the monitoring device comprising:
   a module for defining at least one detection window according to the clock tree; and
   a detector for detecting a transition of each data signal received during a detection window; and
   wherein each detection window is defined so as to enable the detection or anticipation of a fault corresponding to a violation of a rise time or a maintenance time of a data signal relative to a clock signal edge received by the destination sequential element that receives the data signal.

2. The electronic digital circuit as recited in claim 1, wherein said detector of the monitoring device is configured to detect a signal transition on one and the same detection window for multiple received data signals arriving respectively at multiple destination sequential elements.

3. The electronic digital circuit as recited in claim 1, wherein said module for defining at least one detection window includes a generator circuit that is inserted in the clock tree, said generator circuit propagating said clock signal as far as the at least one destination sequential element and delivering at least one timing signal enabling the generation of at least one detection window.

4. The circuit as recited in claim 1, wherein at least one detection window is variable, said module receiving at least one control signal enabling definition of a variable detection window.

5. The circuit as recited in claim 1, wherein at least one detection window is positioned before a clock signal edge.

6. The circuit as recited in claim 1, wherein at least one detection window is positioned around a clock signal edge.

7. The circuit as recited in claim 1, wherein at least one detection window is positioned after a clock signal edge.

8. The circuit as recited in claim 1, wherein the monitoring circuit includes as least one memory element for storing at least one transition detected with the transition detection means.

9. The circuit as recited in claim 5, further including a controller for controlling the clock signal frequency as a function of the transitions detected by the detector.

10. The circuit as recited in claim 7, further including a controller for controlling the operating voltage of the circuit and/or the substrate voltage as a function of the transitions detected by the detector.

11. The circuit as recited in claim 1, wherein the sequential elements are flip-flops of the passing type on a clock signal edge.

* * * * *